United States Patent
Peng et al.

(10) Patent No.: US 7,647,960 B2
(45) Date of Patent: Jan. 19, 2010

(54) HEAT DISSIPATION DEVICE

(75) Inventors: Xue-Wen Peng, Guangdong (CN); Bing Chen, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 782 days.

(21) Appl. No.: 11/307,444

(22) Filed: Feb. 8, 2006

(65) Prior Publication Data
US 2007/0181287 A1    Aug. 9, 2007

(51) Int. Cl.
*H05K 7/20*    (2006.01)
(52) U.S. Cl. .................. 165/80.3; 165/121; 361/697
(58) Field of Classification Search ............. 165/80.3, 165/104.33, 185; 361/697, 700, 704, 710
See application file for complete search history.

(56) References Cited
U.S. PATENT DOCUMENTS

| | | | | |
|---|---|---|---|---|
| 5,927,385 A * | 7/1999 | Yeh | ...................... | 165/80.3 |
| 6,118,658 A * | 9/2000 | Nakase | ..................... | 361/697 |
| 6,382,306 B1 * | 5/2002 | Hsu | ........................ | 165/80.3 |
| 6,412,546 B1 * | 7/2002 | Lin et al. | .................. | 165/80.3 |
| 6,625,021 B1 * | 9/2003 | Lofland et al. | ............. | 361/697 |
| 6,741,470 B2 * | 5/2004 | Isenburg | .................... | 361/704 |
| 6,816,373 B2 * | 11/2004 | Lee et al. | ..................... | 361/697 |
| 7,086,453 B2 * | 8/2006 | Lee et al. | ..................... | 165/80.4 |
| 7,100,681 B1 * | 9/2006 | Wu et al. | .............. | 165/104.33 |
| 7,228,889 B1 * | 6/2007 | Tian et al. | .................. | 165/122 |
| 7,277,288 B2 * | 10/2007 | Lee et al. | ..................... | 361/704 |
| 7,448,438 B2 * | 11/2008 | Xia et al. | .............. | 165/104.33 |
| 2004/0191057 A1 * | 9/2004 | Lee et al. | ................. | 415/121.1 |
| 2005/0237719 A1 * | 10/2005 | Wang et al. | ................. | 361/700 |

* cited by examiner

*Primary Examiner*—Allen J Flanigan
(74) *Attorney, Agent, or Firm*—Winston Hsu (57) ABSTRACT

A heat dissipation device includes a base, a first and second fin sets on the base, and a fan located atop the first and second fin sets. The base has a first face for contacting with an electronic device, and two sloped faces extending from the first face and toward each other. The first fin set defined a channel receiving the base therein. A plat extends from an end of the first face of the base. The second fin set is arranged on the plat of the base. The first face of the base has two grooves defined therein. A retaining member is attached to the first face of the base and has two retaining bars thereof fitted in the two grooves of the first face, respectively.

17 Claims, 7 Drawing Sheets

HEAT DISSIPATION DEVICE

FIELD OF THE INVENTION

The present invention relates generally to a heat dissipation device, and more particularly to a heat dissipation device used for dissipating heat generated by an electronic device.

DESCRIPTION OF RELATED ART

With advancement of computer technology, electronic devices operate rapidly. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Conventionally, a heat dissipation device comprises a base having a flat bottom face and a flat top face, and a plurality of fins arranged on the top face of base. Pluralities of passages are defined between the fins. Furthermore, in order to improve heat dissipation efficiency of the heat dissipation device, a fan is usually attached atop the fins. In use, the bottom face of the base contacts a heat generating electronic device and absorb heat therefrom. The heat then reaches the fins. The fan provides forced convection airflow downwardly to the fins and the base, and removes the heat in the fin to ambient air. However, because of the configuration of the base, when the airflow arrives at the top face, some of it simply rebound upwardly instead of flowing through the passages. Furthermore, when the refluxing airflow meets downward airflow from the fan, turbulence is created, and some of the downward airflow is prevented form entering into the passages of the heat dissipation. Thus, heat dissipation speed and efficiency of the heat dissipation device is retarded, and thus, the heat generated by the electronic device can not be dissipated duly, which impacts abnormal function of the electronic device.

What is needed, therefore, is a heat dissipation device having a great heat dissipating capacity for a heat generating electronic device.

SUMMARY OF INVENTION

A heat dissipation device in accordance with a preferred embodiment of the present invention comprises a base, a first and second fin sets on the base, and a fan located atop the first and second fin sets. The base has a first face for contacting with an electronic device, and two sloped faces extending from the first face and toward each other. The first fin set defined a channel receiving the base therein. The first fin set comprises a plurality of first fins spanning on the base. A plurality of passages is defined between the first fins. Each of the first fins thermally contacts with the two sloped faces of the base. A plat extends from an end of the first face of the base and has a bottom surface coplanar with the first face. The second fin set comprises a plurality of second fins arranged on the plat of the base. A plurality of passages is defined between the second fins. The first face of the base has two grooves defined therein. A retaining member for retaining the heat dissipation device to a printed circuit board is attached to the first face of the base and has two retaining bars thereof fitted in the two grooves of the first face respectively. The first fin set defines a concave in a top thereof. The fan is received in the concave.

Other advantages and novel features will become more apparent from the following detailed description of preferred embodiments when taken in conjunction with the accompanying drawings, in which:

DETAILED DESCRIPTION

Figure 1:
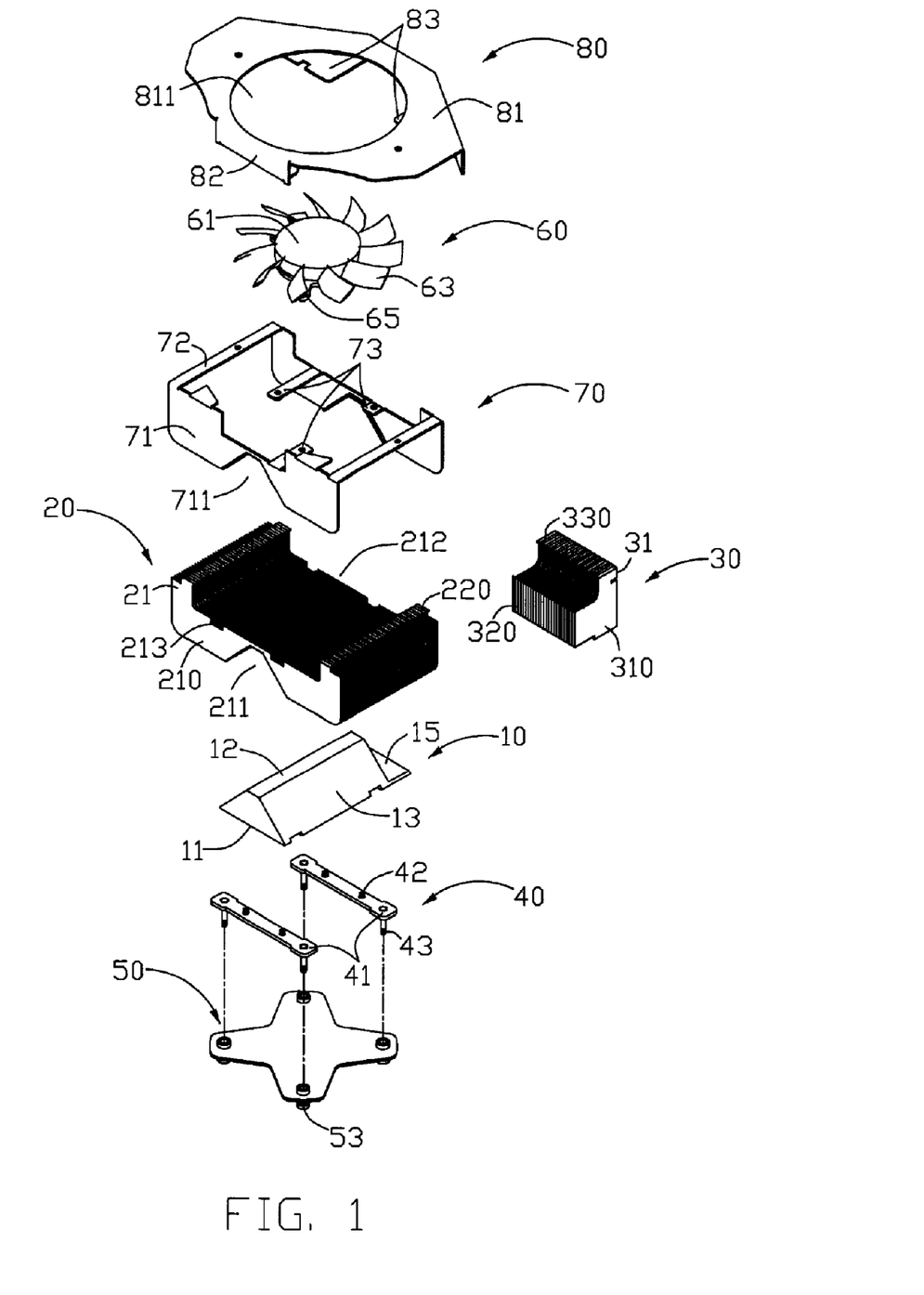
FIG. 1 is an exploded, isometric view of a heat dissipation device in accordance with a preferred embodiment of the present invention.
Figure 2:
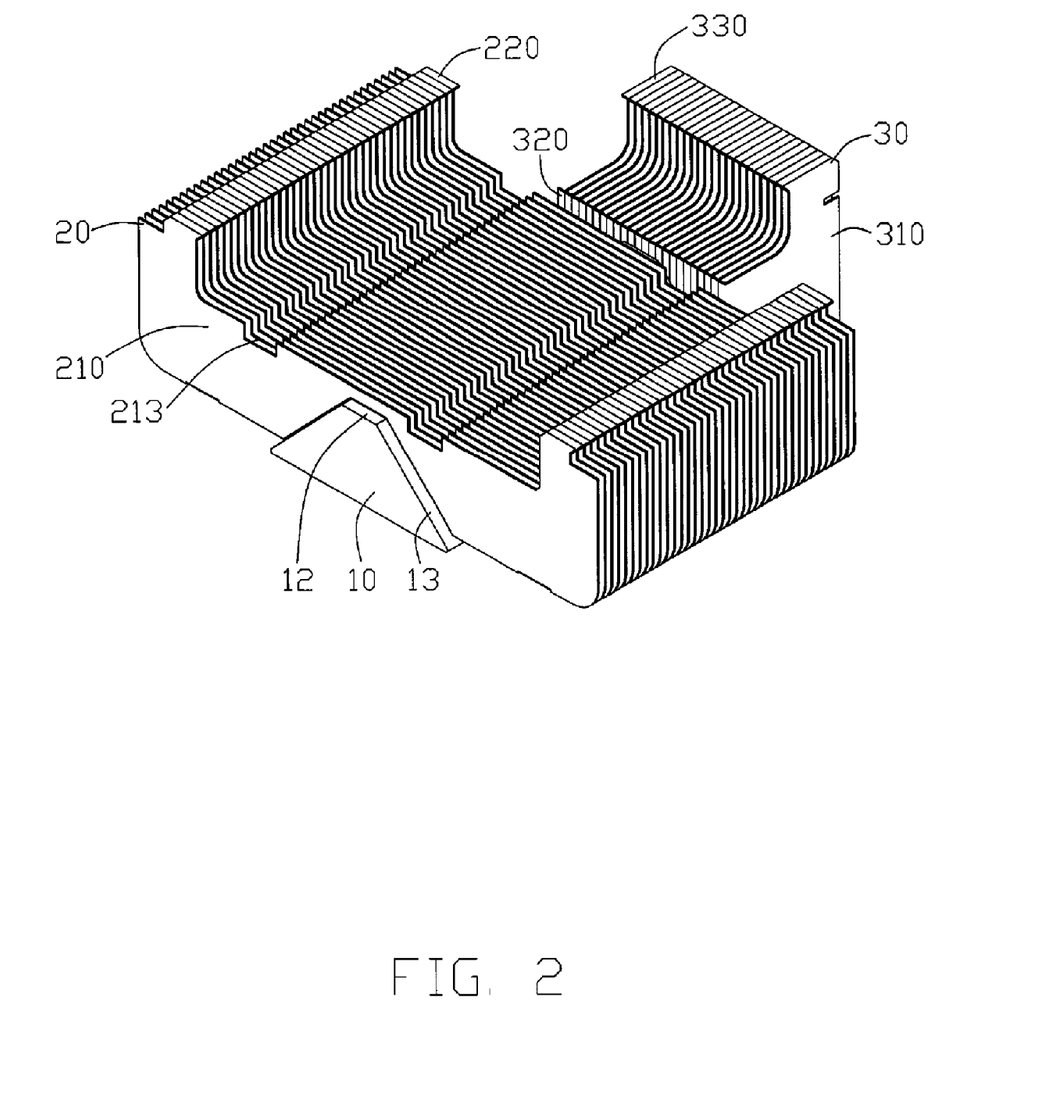
FIG. 2 shows an assembled heat sink of FIG. 1.
Figure 3:
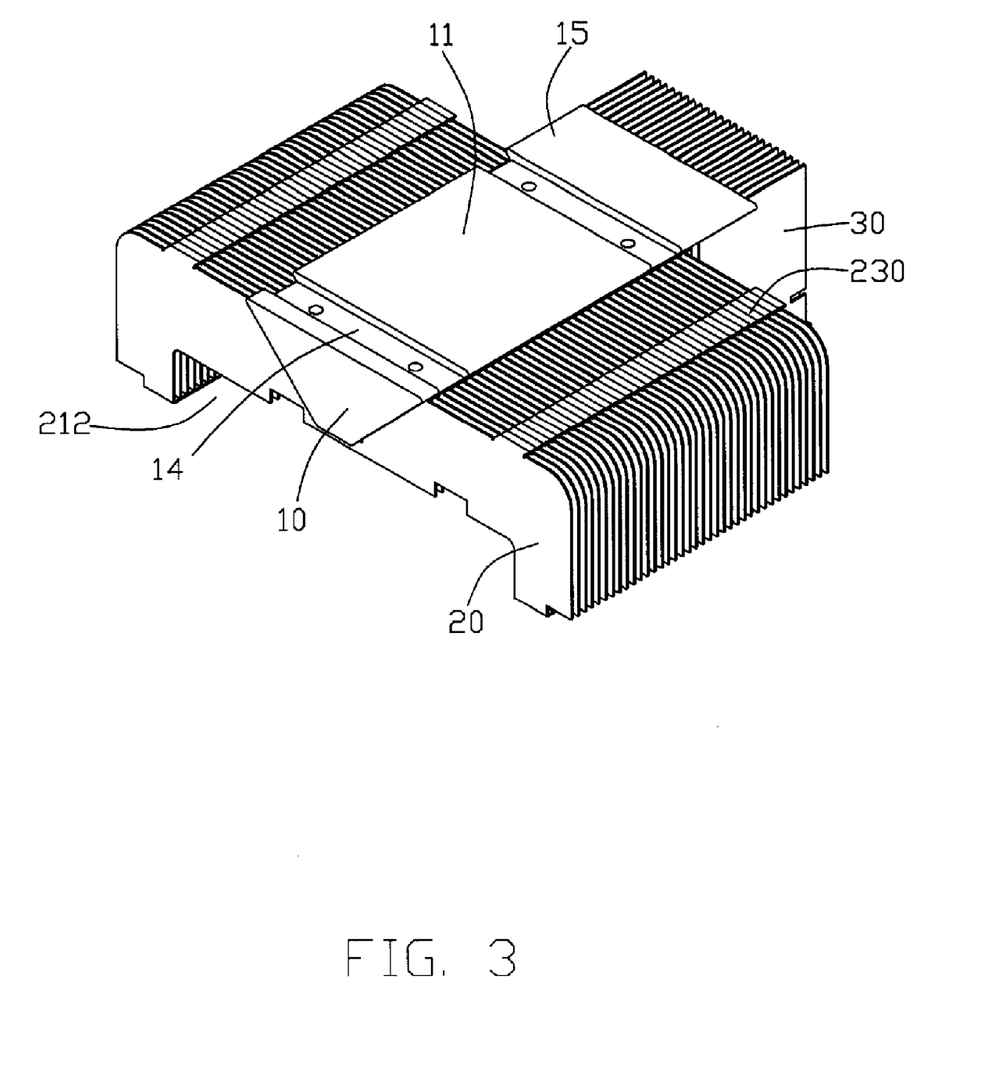
FIG. 3 is an inverted view of FIG. 2.

Referring to FIGS. 1-3, a heat dissipation device in accordance with a preferred embodiment of the present invention comprises a heat sink having a base 10 and first and second fin sets 20, 30 arranged on the base 10, a locking device comprising a retaining member 40 and a back plate 50 for securing the heat sink to an electronic device (not shown) located on a printed circuit board 90 (shown in FIGS. 5 and 6), and a fan unit attached to the heat sink. The fan unit comprises a fan 60, a fan bracket 70 and a fan cover 80.

The base 10 of the heat sink is a substantial elongated foot-paced block which has parallel top and bottom faces 12, 11 and a pair of sloped faces 13 spanning between the top and bottom faces 12, 11. Two parallel grooves 14 are defined in the bottom face 11 adjacent two ends of the base 10, for positioning the retaining member 40. A plat 15 extends outwardly from an end of the bottom face 11. The plat 15 has a bottom surface thereof coplanar with the bottom face 11.

The first fin set 20 comprises a plurality of fins 21 assembled together. Pluralities of passages (not labeled) are defined between the fins 21. Each of the fins 21 comprises a body 210, two first flanges 220 perpendicularly extending from a top edge of the body 210, and two second flanges 230 perpendicularly extending from a bottom edge of the body 210. A trapeziform cutout (not labeled) is defined in a central portion of a bottom of each of the fins 21. In the fin set 20, the first and second flanges 220, 230 of each fin 21 abut top and bottom edges of the body 210 of an adjacent fin 21. The cutouts of the fins 21 of the fin set 20 corporately defining a channel 211 at the bottom of the fin set 20. The channel 211 of the fin set 20 has a profile similar to that of the base 10, for receiving the base 10 therein. A concave 212 is defined in a top of the fin set 20 and between the first flanges 220 of the first fin set 20, for receiving the fan 60 therein. At a bottom of the concave 212, two spaced, parallel slots 213 are defined in a top face of the fin set 20 for positioning the fan bracket 70.

The second fin set 30 comprises a plurality of fins 31 assembled together. Pluralities of passages (not labeled) are defined between the fins 31. Each of the fins 31 is substantial L-shaped, and has a body 310, a first flange 320 perpendicularly extending from a front edge of the body 310, and a second flange 330 perpendicularly extending from a top edge of the body 310. In the second fin set 30, the first and second flanges 320, 330 abut against the front and top edges of the body 310 of an adjacent fin 31.

In assembly of the heat sink, the first fin set 20 spans on the base 10 via the base 10 being received in the channel 211 of the first fin set 20. Each fin 21 of the first fin set 20 thermally contacts the base 10 at the top and two sloped faces 12, 13 of the base 10. The plat 15 of the base 10 extends beyond the first fin set 20. The second fin set 30 is arranged on the plat 15 of the base 10 via a portion of a bottom face of the second fin set 30 thermally contacting to the plat 15. The second fin set 30 faces to the concave 212 of the first fin set. A portion of each passage of the second fin set 30 is not sealed by the plat 15 of the base 10 at the bottom of the second fin set 30.

Referring back to FIG. 1, the retaining member 40 comprises two retaining bars 41. Each bar 41 has two fasteners such as bolts 43 respectively fitted in two fixing holes defined adjacent two ends thereof, respectively. Two screws 42 are respectively inserted in two screwing holes defined in the bar 41 between the two bolts 43.

The back plate 50 is a substantially cross-shaped plate. Four nuts 53 are fitted in four fixing apertures (not labeled) defined at the four apexes of the back plate 50, respectively.

The fan 60 comprises a hub 61, an impeller 63 radially extending from a circumferential periphery the hub 61, and three fixing ears 65 with fixing holes (not labeled) defined therein extending under the impeller 63 from the circumferential periphery of the hub 61.

The bracket 70 comprises two opposite sidewalls 71 and two beams 72 connecting with the two sidewalls 71 at corresponding two ends of the sidewalls 71, respectively. Three fixing tabs 73 with fixing holes (not labeled) defined therein extend from the two sidewalls 71. Each sidewall 71 has a profile substantially similar to that of the body 210 of each fin 21. Two indentations 711 are defined in the two sidewalls 71 corresponding to the two ends of the base 10, respectively.

The fan cover 80 comprises a ceiling 81 with an inlet 811 defined in a center thereof, and first and second sheets 82, 83 depending from the ceiling 81.

Figure 4:
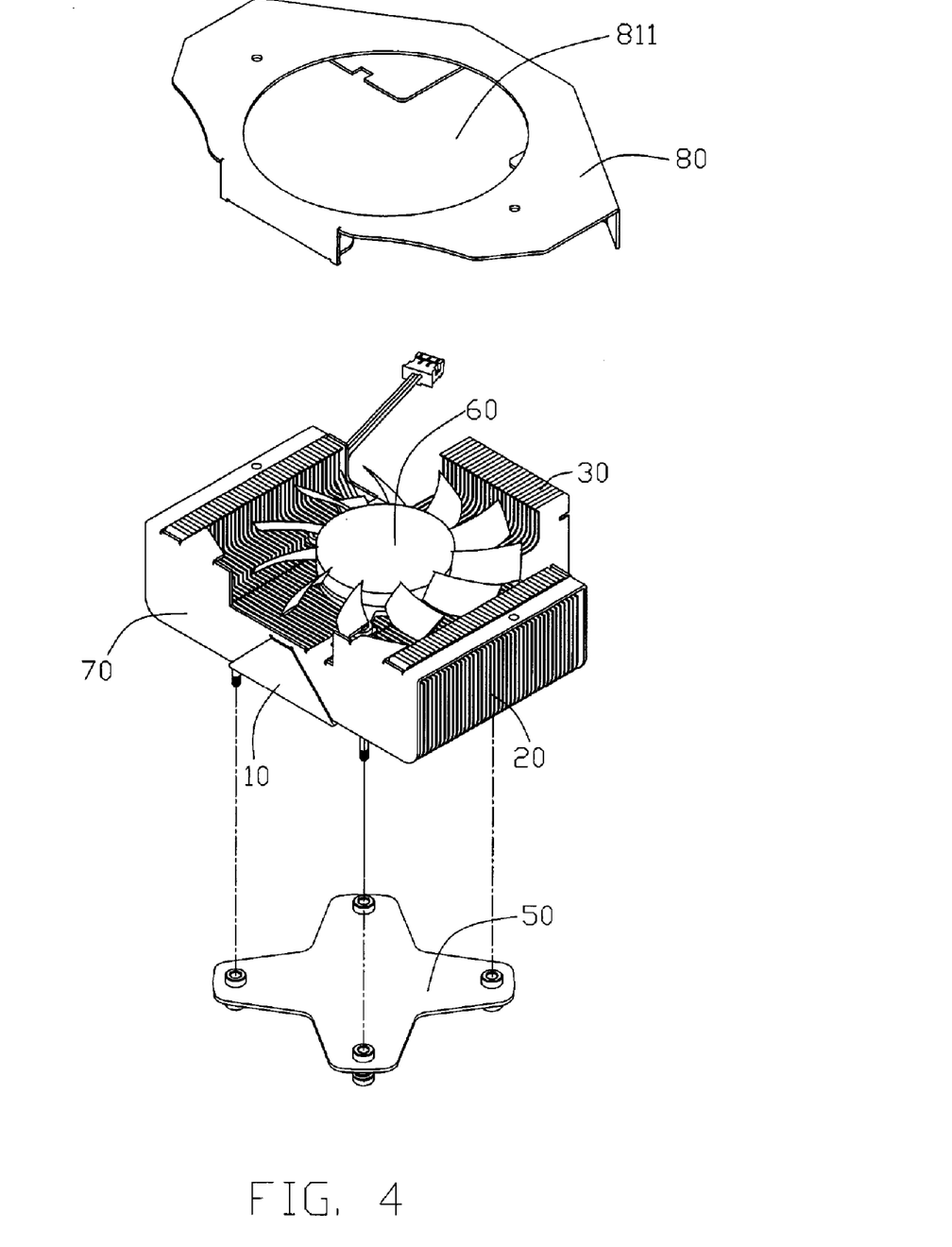
FIG. 4 is a partially assembled view of FIG. 1.

Referring also to FIG. 4, the bracket 70 is attached to the first fin set 20. The two sidewalls 71 of the bracket 70 are disposed at two sides of the first fin set 20, respectively. The two beams 72 are engaged with the top face of the first fin set 20 beside the first flanges 220, respectively. The fan 60 is disposed in the concave 212 of the first fin set 20 and has a portion extending to the second fin set 30. The fixing ears 65 of the fan 60 are fixed to the fixing tabs 73 of the bracket 70 via screws (not labeled) engaged in the fixing holes of the fixing ears 65 and tabs 73.

Figure 5:
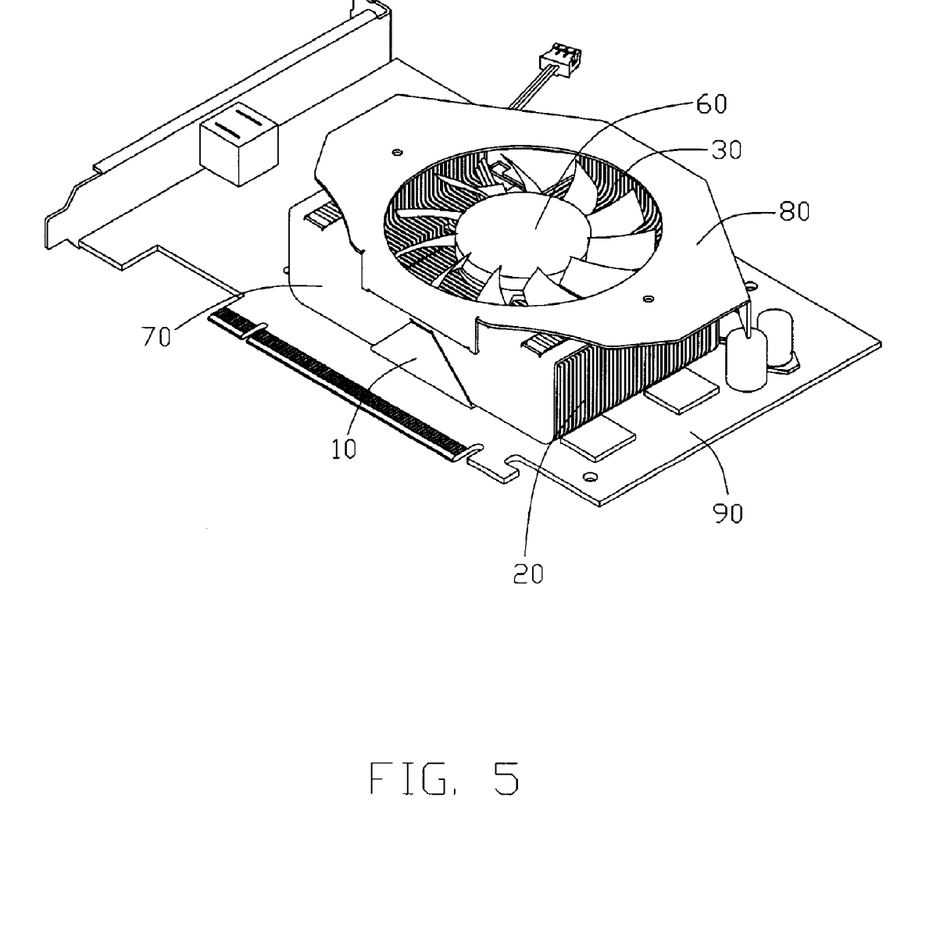
FIG. 5 is an assembled view of FIG. 1 with a printed circuit board.

Referring also to FIG. 5, the fan cover 80 covers on the heat sink with the ceiling 81 thereof hooding on the top of the first and second fin set 20, 30. The first and second sheets 82, 83 are positioned at two sides of the heat sink and shelter the fan 60 in the concave 212. The fan 60 is exposed to an ambient air through the inlet 811 of the ceiling 81.

The two retaining bars 41 of the retaining member 40 are engaged in the two grooves 14 of the base 10 via the screws 42 engaging in the screwing holes of the base 10. The back plate 50 is positioned at a bottom face of the printed circuit board 90. The bolts 43 of the retaining member 40 are aligned with the nuts of the back plate 50, respectively. And the bolts 43 extend through holes defined in the printed circuit board 90 and engage with the nuts 53 of the back plate 50. Therefore, the heat dissipation device is attached to the electronic device with the bottom face 11 of the base 10 contacting with the electronic device.

In use, the base 10 absorbs heat generated by the electronic device and transfers the heat to the first and second fin sets 20, 30. Simultaneously, the fan 60 provides forced airflow to the first and second fin sets 20, 30. The airflow passes through the passages of the first and second fin sets 20, 30 downwards and removes heat in the fins 21, 31 to the ambient air.

According to the preferred embodiment of the present invention, the heat sink of the heat dissipation device has the base 10 foot-paced; therefore, the airflow from the fan 60 passes through the passages of the first and second fin set 20, 30 and unhinderedly exits the heat dissipation device along the sloped faces 13 of the base 10 and lateral sides and the bottom of the second fin set 30. Consequently, the heat generated by the electronic device can be removed from the electronic device and the heat dissipation device rapidly.

Furthermore, the first fin set 20 spans on the base 10 and the second fin set 30 arranged at the plat 15 at the end of the base 10. Therefore, the heat dissipation device has large heat dissipation area without increasing the size of the base 10. Finally, since the fan 60 is mounted in the concave 212 of the first fin set 20 and the second fin set 30 is located at a side of the concave 212 of the first fin set 20, the air flow generated by the fan 60 can be sufficiently used to flow through the first fin set 20 and second fin set 30 thereby efficiently remove the heat from the electronic device.

Figure 6:
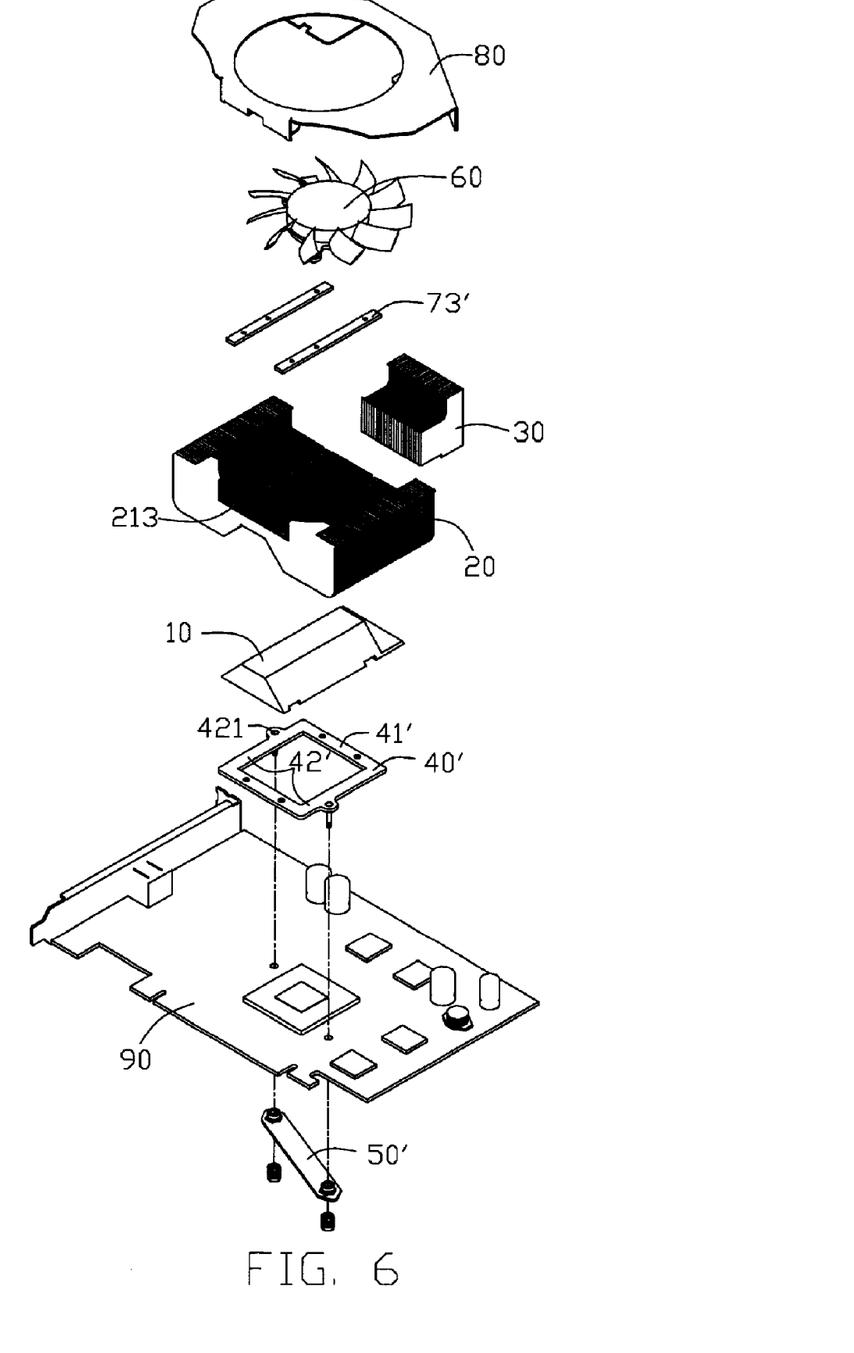
FIG. 6 is an exploded, isometric view of a heat dissipation device in accordance with an alternative embodiment of the present invention.
Figure 7:
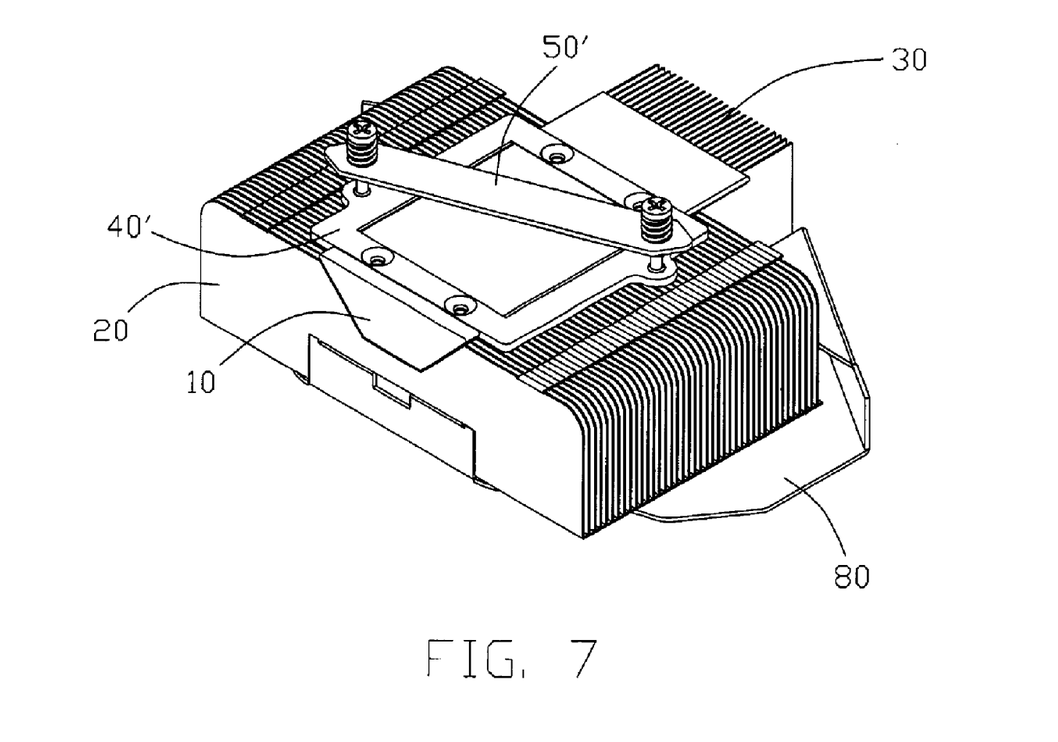
FIG. 7 is an assembled view of FIG. 6 but without a printed circuit board of FIG. 6.

Referring to FIGS. 6 and 7, a heat dissipation device of an alternative embodiment of the present invention is shown. The heat dissipation device is similar to the heat dissipation device of the previous preferred embodiment. The main difference therebetween is in that the fan 60 is attached to the first fin set 20 by two fixing ribs 73' respectively fixed to the slots 213 of the first fin set 20. A retaining member 40' which is substantially a rectangular frame comprises a pair of first beams 41' and a pair of second beams 42'. The two second beams 42' have two outwardly extending ears 421 with two fixing holes (not labeled), respectively. The two first beams 41' are fixedly engaged in the two grooves 14 of the base 10, respectively. The retaining member 40' is fixed to the base 10 with screws (not labeled) fixedly connecting the first beams 41' and the base 10 together. An elongate back bar 50' has two fixing apertures (not labeled) defined adjacent two ends thereof, respectively. The retaining member 40' and the back bar 50' are positioned at opposite faces of the printed circuit board 90, and are fixedly connected together via two bolts (not labeled) and nuts (not labeled) engaging with each other, wherein the bolts each has an upper end secured to a corresponding ear 421 and a threaded lower end extending through the printed circuit board 90 and a corresponding fixing aperture in the back bar 50' and threadedly engaging with a corresponding nut.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a base having a first face for contacting with an electronic device, a second face parallel the first face, and two sloped faces extending from the first face and toward each other, a plat extending from an end of the base and having a bottom surface coplanar with the first face, wherein the two sloped faces span between the first and second faces;
a first fin set spanning on the base, comprising a plurality of first fins thermally contacting with the second face of the base and a plurality of passages defined between the first fins, each of the first fins also thermally contacting with the two sloped faces of the base;

a second fin set arranged on the plat of the base, comprising a plurality of second fins and a plurality of passages defined between the second fins; and a fan located atop the first and second fin sets;

wherein each of the first fins of the first fin set comprises a body defining a trapeziform cutout therein, the cutouts of the first fins of the first fin set corporately define a channel receiving the base therein;

wherein the first fin set defines a concave opposite to the channel thereof and in a top thereof, the fan is received in the concave of the first fin set; and wherein each of the first fins of the first fin set has two first flanges extending from an edge of the body adjacent two ends thereof, and two second flanges extending from an opposite edge of the body adjacent two ends thereof, and wherein the concave is between the first flanges of the first fin set, and the channel is between the second flanges of the first fin set.

2. The heat dissipation device of claim 1, wherein the second fin set is substantially L-shaped and faces to the concave of the first fin set.

3. The heat dissipation device of claim 1 further comprising a retaining member for retaining the heat dissipation device to a printed circuit board, wherein the retaining member is attached to the first face of the base.

4. The heat dissipation device of claim 1 further comprising a fan bracket positioned on the first fin set, wherein the bracket comprises at least two fixing bars positioned on the first fin set, the fan comprising at least two fixing ears fixed to the fixing bars.

5. The heat dissipation device of claim 1 further comprising a fan cover covering the fan, wherein the cover has an inlet communicating with the fan and ambient air.

6. A heat dissipation device comprising:

a base comprising a first face and two sloped faces extending from the first face and toward each other, a plat extending from an end of the base and having a bottom surface coplanar with the first face, the first face defining two grooves therein;

a first fin set defining a channel receiving the base therein, the first fin set comprising a plurality of fins thermally contacting with the two sloped faces of the base;

a second fin set comprising a plurality of fins arranged on the plat of the base;

a retaining member attached to the first face of the base, the retaining member comprising two retaining bars fitted in the two grooves of the first face, respectively, the retaining member securing the heat dissipation device to a printed circuit board; and a fan located atop of the first and second fin sets, wherein the first fin set defines a concave therein, the fan being disposed in the concave, the second fin set being substantially general L-shaped and facing to the concave of the first fin set.

7. The heat dissipation device of claim 6, wherein each retaining bar of the retaining member has two fixing holes defined in two ends thereof, as and two bolts are fitted in the two fixing holes of each retaining bar, respectively, and engage with a back plate located behind the printed circuit board.

8. The heat dissipation device of claim 7, wherein the back plate is a substantially cross-shaped plate, four fixing apertures are defined in four apexes thereof, respectively, the bolts sequentially extend through the four fixing holes of the two retaining bars of the retaining member, four through holes defined in the printed circuit board and the four fixing apertures of the back plate to engage with four nuts fitted in the fixing apertures, whereby the retaining bars and the back plate are secured to two sides of the printed circuit board.

9. The heat dissipation device of claim 6, wherein the retaining member comprises two beams connecting with the two retaining bars at ends thereof.

10. The heat dissipation device of claim 9, wherein two fixing ears extend outwardly from the two beams, respectively, and wherein each ear has a fixing hole defined therein, a bolt fitted in the fixing hole and engaging with a back plate located behind the printed circuit board.

11. The heat dissipation device of claim 10, wherein the back plate is an elongate bar having two fixing apertures defined adjacent two ends thereof, respectively, two nuts being fitted in the two fixing apertures and engaging with the bolts of the ears of the beams of the retaining member.

12. A heat dissipation device comprising:

a base having a bottom face adapted for contacting with a heat-generating electronic component, two sloped faces extending from the bottom face of the base upwardly toward each other, and a plate extending outwardly from an end of the base;

a first fin set mounted on the two sloped face of the base and a second fin set mounted on the plate of the base, the first fin set having a concave in a top thereof, the second fin set located beside the concave of the first fin set and having a general L-shaped configuration; and a fan mounted in the concave and having a portion extending to the second fin set.

13. The heat dissipation device of claim 12 further comprising a fan cover covering the fan.

14. The heat dissipation device of claim 12, wherein the base further comprises a top face opposite to the first face thereof, the two sloped faces span between the first and second faces.

15. The heat dissipation device of claim 14, wherein the first fin set comprises a plurality of first fins thermally contacting with the two sloped faces and the top face of the base.

16. The heat dissipation device of claim 15, wherein each of the first fins of the first fin set comprises a body defining a trapeziform cutout therein, the cutouts of the first fins of the first fin set corporately define a channel receiving the base therein.

17. The heat dissipation device of claim 16, wherein each of the first fins of the first fin set has two first flanges extending from a top edge of the body adjacent two ends thereof, and two second flanges extending from a bottom edge of the body adjacent two ends thereof, and wherein the concave is between the first flanges of the first fin set, and the channel is between the second flanges of the first fin set.

\* \* \* \* \*

UNITED STATES PATENT AND TRADEMARK OFFICE
CERTIFICATE OF CORRECTION

PATENT NO. : 7,647,960 B2  Page 1 of 1
APPLICATION NO. : 11/307444
DATED : January 19, 2010
INVENTOR(S) : Peng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1017 days.

Signed and Sealed this

Sixteenth Day of November, 2010

David J. Kappos
*Director of the United States Patent and Trademark Office*